United States Patent
Nakajima et al.

(10) Patent No.: US 7,476,812 B2
(45) Date of Patent: Jan. 13, 2009

(54) PRINTED CIRCUIT BOARD AND MANUFACTURING METHOD THEREOF

(75) Inventors: Kanako Nakajima, Ryugasaki (JP); Masatoshi Inaba, Abiko (JP); Yoshiharu Unami, Tomisato (JP)

(73) Assignee: Fujikura Ltd., Tokyo (JP)

( * ) Notice: Subject to any disclaimer, the term of this patent is extended or adjusted under 35 U.S.C. 154(b) by 178 days.

(21) Appl. No.: 11/508,277

(22) Filed: Aug. 23, 2006

(65) Prior Publication Data

US 2007/0049060 A1 Mar. 1, 2007

(30) Foreign Application Priority Data

Aug. 24, 2005 (JP) .................. P2005-242494

(51) Int. Cl.
*H05K 1/00* (2006.01)
(52) U.S. Cl. .................... 174/254; 174/117 F
(58) Field of Classification Search ........... 174/254, 174/117 F
See application file for complete search history.

(56) References Cited

U.S. PATENT DOCUMENTS

| 6,602,584 B2 * | 8/2003 | Jo et al. ............... 428/209 |
| 6,811,431 B2 * | 11/2004 | Hsieh .................. 439/495 |
| 7,067,912 B2 * | 6/2006 | Takeuchi et al. .......... 257/688 |

FOREIGN PATENT DOCUMENTS

| JP | 04048677 | * | 2/1998 |
| JP | 2002-314207 A | | 10/2002 |

* cited by examiner

Primary Examiner—Ishwar (I. B.) Patel
(74) Attorney, Agent, or Firm—Sughrue Mion, PLLC

(57) ABSTRACT

A printed circuit board includes a flexible insulated substrate with a first surface and a second surface at both sides respectively, a wiring layer on the first surface, a reinforcement plate on a part of the second surface and an auxiliary layer between the second surface and the reinforcement plate. A reinforcement edge side of the reinforcement plate is located at the outside of an auxiliary edge side of the auxiliary layer.

7 Claims, 3 Drawing Sheets

PRINTED CIRCUIT BOARD AND MANUFACTURING METHOD THEREOF

This application is based upon Japanese Patent Application No. P2005-242494, filed on Aug. 24, 2005, in the Japanese Patent Office, the disclosure of which is incorporated herein in its entirety by reference.

BACKGROUND OF THE INVENTION

1. Field of the Invention

The present invention relates to a printed circuit board, more specifically to a flexible printed circuit board including a reinforcement board and a manufacturing method thereof.

2. Description of the Related Art

Recently, because of miniaturization of elements and reduction in the size of electronic devices, such as portable telephones and digital cameras, the interior space in these electronic devices has decreased. Therefore, it is difficult to provide electronic elements, such as a printed circuit board or a wiring board in such a small space.

Generally, a flexible board, such as a FPC (a flexible printed circuit board) and an FPWB (a flexible printed wiring board) is used widely as a suitable solution for such a narrow, small space. The FPC may be modified with a reinforcement board attached at, for example, a connector part or an element mounting part of the board in order to increase mechanical integrity and to increase the rigidity in the portions.

FIGS. 1A and 1B (prior art 1) and 2A-2C (prior art 2) illustrate the technology of a FPC with the reinforcement board in prior art.

In the FPC shown in FIG. 1A, a wiring layer 22 is formed by patterning a copper foil adhered to a insulated substrate 21 made of a polyimide resin. The sections of reinforcement board 23a and 23b are formed correspond to the reinforcement portions X1 and X2 in the wiring layer 22, as a connector part which needs to be reinforced. The reinforcement boards 23a and 23b are arranged to face the adhesive layers 24a and 24b provided on a face of each reinforcement board 23a and 23b in the direction of an undersurface of the insulated substrate 21.

Positioning holes 25a1 and 25b1 in the insulated substrate 21 and the positioning holes 25a2 and 25b2 in the reinforcement boards 23a and 23b overlap with each other to receive the guide pins 26a and 26b, respectively. Then, the reinforcement boards 23a and 23b are positioned to face the reinforcement portions X1 and X2. As shown in FIG. 1B, the reinforcement boards 23a and 23b are pressed towards the undersurface of the insulated substrate 21 under high temperature and high-pressure conditions, and secured thereto by the adhesives layers 24a and 24b, In this case, the guide pins 26a and 26b are removed. The technique to attach the sections of reinforcement board to the insulated substrates by the adhesive layers is described in Japanese Patent Laid-Open Publication No. 2002-314207.

A technique developed by the present inventor is shown in FIG. 2A. A reinforcement substrate 33 is adhered by thermo-compression bonding, for example, to an undersurface of a polyimide resin insulated substrate 31 that has a copper foil 32a on the upper surface. A wiring layer 32 is formed by patterning the copper foil 32a as shown in FIG. 2B. As shown in FIG. 2C, the photo-mask layers 34 and 35 are formed on an undersurface of the reinforcement substrate 33, corresponding to the reinforcement portions X1 and X2, so as to increase structural integrity. The reinforcement plates 33a and 33b are formed by chemical etching on the exposed portion of the reinforcement substrate 33.

The insulated protection layers 27 and 36 on the wiring layers 22 and 32, such as a solder resist, are shown in FIG. 1A and FIG. 2C, respectively, and the deformable portion is indicated as Y.

However, according to the prior art 1 shown in FIG. 1A, the adhesives layers 24a and 24b spread along the undersurface of the insulated substrate 21 through the side of the reinforcement plates 23a and 23b, due to applied pressure at the time of adhesion. The overflow portions 29a and 29b are generated due to the applied pressure, which may adhere unnecessary materials that prevent the deformation of the insulated substrate 21.

Moreover, positioning of the reinforcement plates 23a and 23b requires the positioning holes and the guide pins so that the manufacturing operation is complicated. There is a problem that positioning accuracy is as low as about ±100 micrometers positioning gap. As the printed circuit board becomes smaller, the problem becomes more serious. When the positioning is performed by visual adjustment, the accuracy is further decreased.

As shown in FIG. 2C, the positioning accuracy is improved in the prior art 2 since it is based on photolithography technology. But, since the etching near the insulated substrate 31 is slow, a taper etching of the side wall of the reinforcement plates 33a and 33b is carried out and the skirt portions 36a and 36b of each taper, which approaches and extends toward the insulated substrate 31 may form a sharp edge. Therefore, when the insulated substrate 31 is twisted and bent on an apparatus, the insulated substrate 31 may be damaged and develop a fracture in response to the concentration of stress at one point.

SUMMARY OF THE INVENTION

According to a first aspect of the present invention, a printed circuit board comprises a flexible insulated substrate with a first surface and a second surface at both sides, respectively, a wiring layer on the first surface, a reinforcement plate on a part of the second surface and an auxiliary layer between the second surface and the reinforcement plate. A reinforcement edge side of the reinforcement plate is located at the outside of an auxiliary edge side of the auxiliary layer.

According to a second aspect of the present invention, a manufacturing method is provided for a printed circuit board with a flexible insulated substrate having a first surface and a second surface at the sides thereof respectively. The method comprises forming a wiring layer by patterning on the first surface of the flexible insulated substrate, placing a reinforcement material on the second surface of the flexible insulated substrate via an auxiliary material, forming a pattern mask layer to partially expose a surface of the reinforcement material and shaping an auxiliary layer and a reinforcement plate from remaining parts of the materials by etching the exposed surface. The etching process for the auxiliary material is faster than the reinforcement material.

DETAILED DESCRIPTION OF THE EXEMPLARY, NON-LIMITING EMBODIMENTS

Figure 1A:
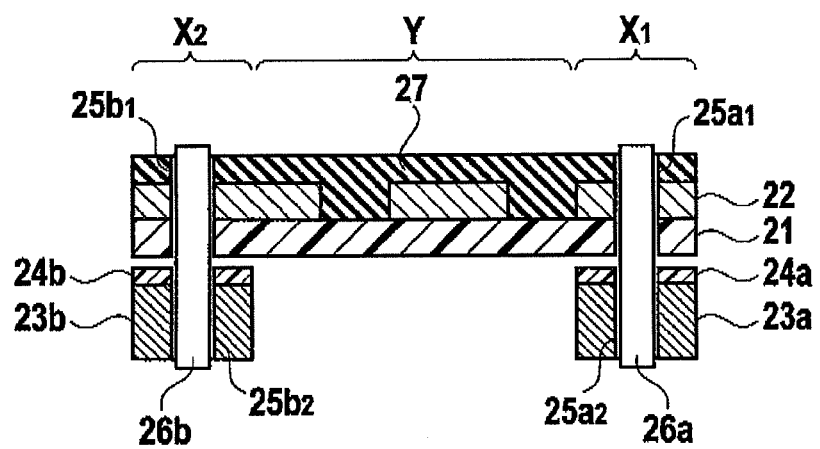
FIG. 1A is a process sectional view showing a process of the manufacturing method of the printed circuit board according to the prior art.
Figure 1B:
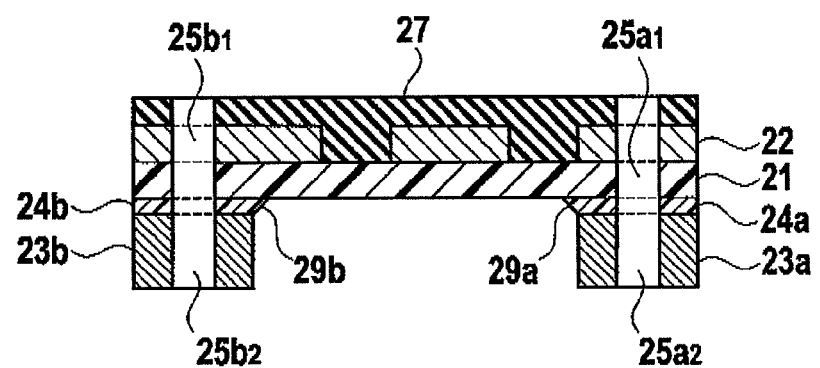
FIG. 1B is a process sectional view showing a process of the manufacturing method of the printed circuit board according to the prior art.

Various exemplary, non-limiting embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth to provide a thorough understanding of the present invention. However, it will be obvious to those skilled in the art that the present invention may be practiced without such specific details.

(A Printed Circuit Board)

Figure 3:
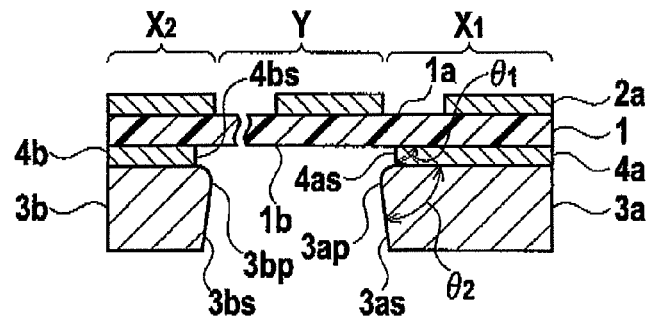
FIG. 3 is a sectional view showing the printed circuit board according to an exemplary, non-limiting embodiment of the present invention.

A printed circuit board according to an exemplary, non-limiting embodiment of the present invention is explained using FIG. 3.

A flexible insulated substrate 1 having a first surface 1a at one side and a second surface 1b at another side is made of a polyimide resin or a liquid crystal polymer. A wiring layer 2a of a circuit pattern formed on the first surface 1a is made of copper foil. The wiring layer 2a has parts corresponding to the reinforcement portions X1 and X2, such as a connector part or an element mounting part which needs reinforcement, and the deform able portion Y which does not require reinforcement.

The reinforcement plates 3a and 3b are positioned on the second surface 1b at positions corresponding to the reinforcement portions X1 and X2, respectively. The reinforcement plates 3a and 3b are placed on the second surface 1b with the auxiliary layers 4a and 4b therebetween. The plates 3a and 3b are secured to the surface 1b by thermo-compression bonding.

A thin copper material with a thickness of about 10 micrometers, as the auxiliary layers, is formed on a surface of a thick metal material with a thickness of about 90 micrometers, as the reinforcement plates. A pattern mask is exposed on the surface corresponding to the reinforcement portions X1 and X2 by photolithography. Then, the reinforcement plates 3a and 3b, of stainless metal material, and the auxiliary layers 4a and 4b, of copper, are shaped by chemical etching. For example, the reinforcement plates and the auxiliary layers are formed in the shape of a rectangle.

A reinforcement edge side 3as (3bs) of the reinforcement plate 3a (3b) is located at the outside of an auxiliary edge side 4as (4bs) of the auxiliary layer 4a (4b). In other words, the insulated substrate 1, the undersurface 1b of the insulated substrate 1, the auxiliary edge side 4as (4bs) and the reinforcement edge side 3as (3bs) comprise a concave wall. The auxiliary edge side 4as (4bs) is located in an indented position from the reinforcement edge side 3as (3bs).

Because of the position between the auxiliary edge side 4as (4bs) and the reinforcement edge side 3as (3bs), the insulated substrate 1 is bent first at the auxiliary edge side 4as (4bs). Next, the insulated substrate 1 is bent at the reinforcement edge side 3as (3bs) when the deformable portion Y of the insulated substrate 1 is bent in a direction which brings the reinforcement plates 3a and 3b mutually closer. Therefore, a bending stress to the insulated board 1 is dispersed to the edge sides, and a concentration of the stress at one point is avoided so that damage and fractures are mitigated.

Even when the auxiliary edge side 4as (4bs) and the reinforcement edge side 3as (3bs) are in the same plane, the sharp edge of the reinforcement plate in the prior art 2 is not formed and damage and fractures are also mitigated.

As shown in FIG. 3, when each angle of inclination corner $\theta_1$ between the auxiliary edge side 4as (4bs) and the second surface 1b, and inclination corner $\theta_2$ between the reinforcement edge side 3as (3bs) and the surface of the reinforcement plate 3a (3b) is changed to about 90-degrees, the inclination is so gentle compared with the sharp edge of the reinforcement plate, in the prior art 2, that damage and fractures are further mitigated.

Furthermore, as illustrated in FIG. 3, a boundary part 3ap (3bp) of the reinforcement edge side 3as (3bs) near the auxiliary layer 4a (4b) is formed gentle curvature. Then the concentration of stress to the insulated board 1 is avoided and also damage and fractures of the insulated board 1 are mitigated.

(A Manufacturing Method of a Printed Circuit Board)

A manufacturing method of a printed circuit board with a reinforcement plate according to the exemplary, non-limiting embodiment of the present invention is explained using FIG. 3 and FIG. 4

Figure 4A:
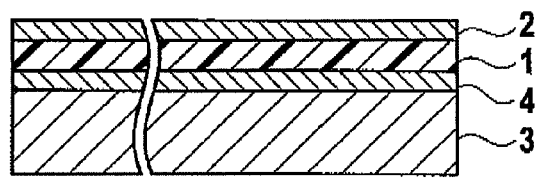
FIGS. 4A-4D are process sectional views showing a process of the manufacturing method of the printed circuit board according to an exemplary, non-limiting embodiment of the present invention.

First, as shown in FIG. 4A, for example, stainless steel, copper, copper alloy, brass, aluminum, phosphorus bronze, beryllium copper, or nickel is used as a reinforcement material 3. A copper plating layer with a thickness of about 10 micrometers as an auxiliary material 4, is formed on the entire surface of a stainless steel material with a thickness of about 90 micrometers, as the reinforcement material 3. The etching speed of the auxiliary material 4 is faster than the reinforcement material 3.

Then, a thermoplastic resin film having a thickness from about 10 to 25 micrometers, made of polyimide resin or a liquid crystal polymer, is laid on the entire upper surface of the auxiliary material 4, as the insulated substrate 1. The copper foil thickness in a range from about 3 to 35 micrometers is laid on the entire upper surface of the insulated substrate 1, as an electrical conductive material 2.

Next, the auxiliary material 4, the insulated substrate 1 and the electrical conductive material 2 are adhered directly by thermo-compression bonding, that is, by carrying out a press heating operation of the reinforcement material 3, the auxiliary material 4, the insulated substrate 1, and the electrical conductive material 2 at a temperature in a range from about 260 to 300° C. In this process, by applying a pressing force while heating at a temperature higher than the glass transition temperature Tg, mobility of the thermoplastic resin, which is the material of the insulated substrate 1, is increased. In the press heating process, the thermoplastic resin adheres firmly to the uneven surface of the auxiliary material 4.

At least, the surface of the insulated substrate 1 should just consist of the thermoplastic resin. Therefore, to make the insulated substrate 1 about 25 micrometers thick, a thermoplastic polyimide of about 2.5 micrometers thickness is laid over both sides of the thermosetting polyimide film such as a capton or an apical with a thickness of about 20 micrometers.

Figure 4B:
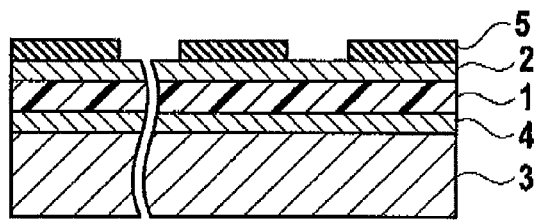
Figure 4C:
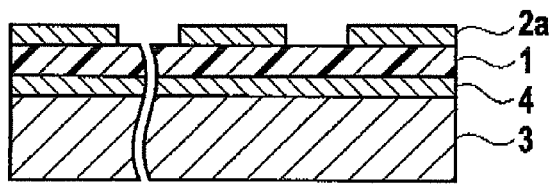

Next, as shown in FIG. 4B, a pattern mask layer 5 of a photoresist is formed on the upper surface of the electrical conductive material 2 by photolithography technology. The wiring layer 2a with patterned circuits is formed by removing the portion of the conductive material exposed from the pattern mask layer 5, alternatively among the electrical conductive material 2 (copper foil), by chemical etching as shown in FIG. 4C. Then, the pattern mask layer 5 is removed. Although not illustrated, an insulating protection film may cover the wiring layer 2a surface, if needed.

Figure 4D:
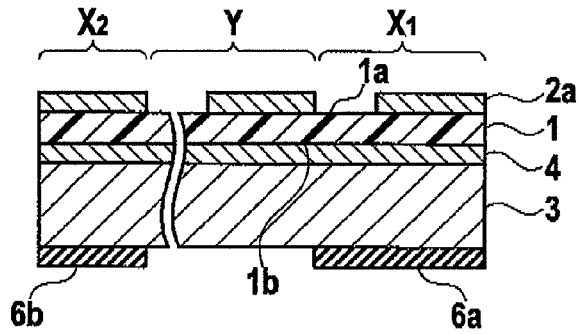

As shown in FIG. 4D, the pattern mask layers 6a and 6b of the photoresist are formed on the undersurface of the reinforcement material 3 in the position of the wiring layer 2a, corresponding to the reinforcement portions X1 and X2, which need reinforcement like the connector part and the elements mounting part, respectively.

Then, chemical etching is carried out on the reinforcement material 3 and the auxiliary material 4 until the second surface (undersurface) 1b of the insulated substrate 1 is exposed. The etching is performed by soaking the portion uncovered with the pattern mask layers 6a and 6b of the reinforcement material 3 in an etching liquid of ferric chloride solution, as shows to FIG. 3. The etching liquid is about 38 to 50 Baume degrees (specific gravity; about 1.35 to 1.53).

In the etching process of the reinforcement material 3 and the auxiliary material 4, the portion of the reinforcement material 3 and the auxiliary material 4 corresponding to the deformable portion Y, is removed alternately. Thus, the printed circuit board which has the reinforcement plates 3a and 3b and the auxiliary layers 4a and 4b shown in FIG. 3 is formed.

That is, the reinforcement plates 3a and 3b and the auxiliary layers 4a and 4b are foamed substantially in the shape of a rectangle, by etching, using the pattern mask provided by photolithography technology, with a positioning accuracy of about ±20 micrometers or less, corresponding to the reinforcement portions X1 and X2, respectively.

Figure 2A:
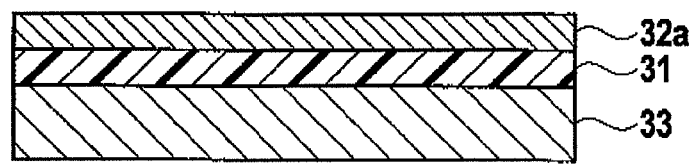
FIGS. 2A-2C are process sectional views showing a process of the manufacturing method of the printed circuit board according to the prior art.
Figure 2B:
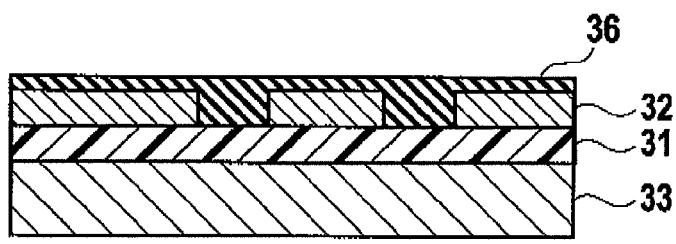
Figure 2C:
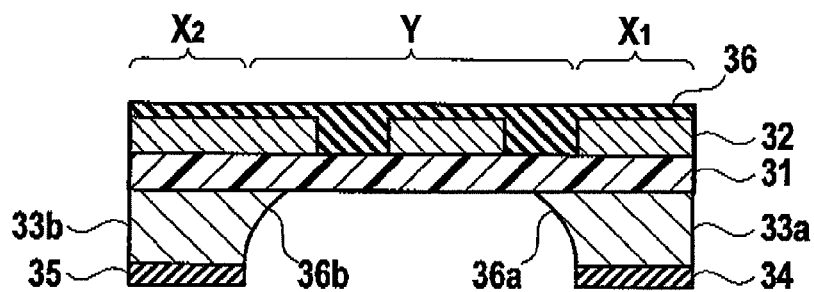

Since the auxiliary material 4 has an etching speed faster than the reinforcement material 3 in the etching liquid, etching of the auxiliary layers 4a and 4b tends to advance uniformly. The angle of inclination of the corner $\theta_1$ between the second surface 1b and the auxiliary edge sides 4as and 4bs, is formed 90 degrees (i.e., is a quite obtuse angle compared with the edges 36a and 36b shown in FIG. 2C as the prior art 2). Therefore, a sharp edge part like the prior art be adjusted in 2 is not formed in the auxiliary layers 4a and 4b close to the second surface (undersurface) 1b of the insulated substrate 1. In addition, the angle of inclination of the corner $\theta_1$ can be adjusted in the range of 70 to 90 degrees by etching control of the etching liquid, or the etching time, and so on.

Since the reinforcement material 3 is about 9 times thicker than the auxiliary material 4, the reinforcement edge sides 3as and 3bs of the reinforcement boards 3a and 3b have a large etching depth and a taper etching side indicated as the angle of inclination of the corner $\theta_2$ compared to the second surface 1b (or upper surface of the reinforcement plate). However, it is easy to carry out etching control of the angle of inclination of the corner $\theta_2$ in the range of about 60 to 80 degrees. The angle of inclination of the corner $\theta_2$ is more gentle than the sharp edge of the reinforcement plate of the prior art 2.

The boundary parts 3ap and 3bp of the reinforcement edge sides 3as and 3bs, near the auxiliary layers 4a and 4b (skirt of the taper) are projections. But, the boundary parts 3ap and 3bp are separated from the second surface 1b of the insulated substrate 1 by the auxiliary layer 4. An abutting location of the projecting boundary parts 3ap and 3bp to the insulated substrate 1, when the insulated substrate 1 is bent, mitigates the stress concentration at abutting portions. Moreover, since the projecting boundary parts 3ap and 3bp are formed with a gentle curvature by etching, concentration of the abutting stress to the insulated substrate 1 is avoided.

According to the positioning, the reinforcement edge side 3as (3bs) is located at the outside of the auxiliary edge side 4as (4bs). In other words, the insulated substrate 1, the second surface (undersurface) 1b of the insulated substrate 1, the auxiliary edge side 4as (4bs) and the reinforcement edge side 3as (3bs) form a concave wall. The auxiliary edge side 4as (4bs) is located in an indented position with respect to the reinforcement edge side 3as (3bs).

Because of the position between the reinforcement edge side 3as (3bs) and the auxiliary edge side 4as (4bs), the insulated substrate 1 is bent first at the auxiliary edge side 4as (4bs), and next, at the reinforcement edge side 3as (3bs) when the deformable portion Y of the insulated substrate 1 is subjected to substantial bending. Therefore, the bending stress to the insulated board 1 is dispersed to these edge sides, and the concentration of stress at one point is avoided so that damage and fractures are mitigated.

As mentioned above, the aspects of the exemplary, non-limiting embodiment are (1) the angle of inclination of the corner $\theta_1$ between the second surface 1b and the auxiliary edge side 4as (4bs) is formed to be substantially 90 degrees; (2) the angle of inclination of the corner $\theta_2$ between the reinforcement edge side 3as (3bs) and the upper surface of the reinforcement plate (or the second surface 1b) is more gently curved than the sharp edge of the reinforcement plate of the prior art 2; and, (3) the reinforcement edge side 3as (3bs) Is located at the outside of an auxiliary edge side 4as (4bs). Each of these aspects (1), (2), and (3) has the effect of preventing damage in bending or curving of the insulated substrate 1, and when all of these aspects cooperate, damage and fractures are mitigated further.

According to the aspect (3), even if the auxiliary edge side 4as (4bs) and the reinforcement edge side 3as (3bs) are at the same face, the sharp edge of the reinforcement plate in the prior art 2 is not formed and damage and fractures are mitigated.

According to the manufacturing method of the exemplary, non-limiting embodiment, it is not necessary to use an adhesive layer that is described in the prior art 1. Thus, adhesion of an unnecessary substance can be avoided when the laminated structure shown in FIG. 4A is formed.

Moreover, the order of the patterning process of the wiring layer 2a and the patterning process of the reinforcement plates 3a and 3b can be suitably set. When the patterning process of the wiring layer 2a is performed where the auxiliary material 4 and the reinforcement material 3 are laid on the undersurface of the insulated substrate 1, as shown in FIG. 4B and FIG. 4C, generation of creases or folds can be prevented in the insulated substrate 1 and the electrical conductive material layer 2. Therefore, the patterning accuracy of the wiring layer 2a can be kept high, and it is especially effective in the manufacture of thin printed circuit boards.

In addition, there are other methods of forming the laminating structure shown in FIG. 4A. Those are (A) a method of thermo-compression bonding of a sheet-like electrically conductive material for the electrical conductive material layer 2 on the spread insulation board 1 after spreading the insulated board 1 on the auxiliary material 4 by applying the liquefied thermoplastic resin for the insulated boards 1 on the surface of the auxiliary material 4 and drying; (B) a method of plating or sputtering the electrical conductive material for layer 2 on the spread insulation substrate 1 instead of the thermo-compression bonding of the sheet-like electrically conductive material in the method of the (A); (C) a method of adhering the reinforcement material 3 on the opposite side (the second surface) of the insulated substrate 1 through the auxiliary material 4 while a laminating object is prepared beforehand to adhere the electrical conductive material layer 2 on one side (the fit surface) of the insulated substrate 1. Each method of these (A), (B) and (C) does not require the adhesive layer, and it can be applied alternatively according to the requirement, of the printed circuit board, such as a adaptability, parts cost, or manufacturing cost.

Various combinations of the materials are possible if the etching speed of the auxiliary material is faster than that of the reinforcement material. In this case, etching formation of the reinforcement plate or the auxiliary layer can be ensured without etching the insulated substrate 1 by using metal materials for each material. And the etching control is easy. Aluminum may be used as the reinforcement material 3 instead of stainless steel. Iron or on iron alloy may be used as tie auxiliary material 4 instead of copper.

Although the auxiliary layer, which is thinner than the reinforcement plate, connects the reinforcement plate and the insulated substrate, a two layer structure comprising the auxiliary layer and the reinforcement plate can be used as a reinforcement plate.

While the invention has been particularly shown and described with reference to the exemplary non-limiting embodiments thereof, the present invention is not limited to the embodiments. Note that without departing from the scope of the invention, it is possible for a person having ordinary skill in the art to make additions, deletions, replacements and other alterations. The scope of the invention is not limited by the detailed description of specific embodiments, but is only defined by the claims appended hereto, and their equivalents.

What is claimed is:

1. A printed circuit board, comprising:
   a flexible insulated substrate having a first surface and a second surface;
   a wiring layer disposed on the first surface;
   a reinforcement plate disposed on a portion of the second surface, said reinforcement plate having a reinforcement edge side included in a circumferential surface thereof; and
   an auxiliary layer disposed between the second surface and the reinforcement plate, said auxiliary layer having an auxiliary edge side in a circumferential surface thereof,
   wherein, the auxiliary edge side of the auxiliary layer is arranged between the second surface and the reinforcement edge side, and is indented from the reinforcement edge side of the reinforcement plate.

2. The printed circuit board according to claim 1, wherein the reinforcement plate comprises a metal material.

3. The printed circuit board according to claim 2, wherein the reinforcement edge side of the reinforcement plate is curved.

4. The printed circuit board according to claim 1, wherein the auxiliary layer comprises a copper material.

5. The printed circuit board according to claim 1, wherein the reinforcement layer is thicker than the auxiliary layer.

6. The printed circuit board according to claim 1, wherein the angle of inclination between the second surface and the auxiliary edge side is substantially 90°.

7. The printed circuit board according to claim 1, wherein the auxiliary layer is a material being etched faster than the reinforcement plate while the auxiliary layer and the reinforcement plate are etched.

* * * * *